(12) United States Patent
Mori (10) Patent No.: US 6,624,020 B2
(45) Date of Patent: Sep. 23, 2003

(54) FABRICATION METHOD OF SEMICONDUCTOR DEVICE WITH CAPACITOR

(75) Inventor: Kiyoshi Mori, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/131,479

(22) Filed: Apr. 25, 2002

(65) Prior Publication Data

US 2003/0100156 A1 May 29, 2003

(30) Foreign Application Priority Data

Nov. 27, 2001 (JP) ........................................ 2001-361048

(51) Int. Cl.⁷ ......................................... H01L 21/8242
(52) U.S. Cl. ...................................... 438/243; 438/386
(58) Field of Search ................................ 438/238, 239, 438/243, 244, 253, 254, 255, 381, 386, 396, 680

(56) References Cited

U.S. PATENT DOCUMENTS 5,618,761 A * 4/1997 Eguchi et al. ............... 438/785
5,633,181 A * 5/1997 Hayashi ...................... 438/234
6,049,103 A * 4/2000 Horikawa et al. ........... 257/303
6,395,599 B1 * 5/2002 Ema et al. ................... 438/253

FOREIGN PATENT DOCUMENTS

JP         2001-203334         7/2001

* cited by examiner

Primary Examiner—David Nhu
(74) Attorney, Agent, or Firm—McDermott, Will & Emery (57) ABSTRACT

In a fabrication method of semiconductor device, a storage node connected to one of source/drain regions of an MOS (Metal Oxide Semiconductor) transistor provided at a semiconductor substrate is formed along a trench provided through a silicon nitride film, a BPTEOS (Boro Phospho Tetra Ethyl Ortho Silicate) film and a silicon oxide film grown at low temperature. The silicon oxide film grown at low temperature is formed by either atmospheric pressure CVD (chemical vapor deposition) or plasma CVD. Also, a sidewall protection film is formed so as to prevent shorting between adjacent capacitors by growing a film at low temperature. Thus, a semiconductor device of high performance and high reliability can be provided even in a system LSI (Large Scale Integrated circuit) in which a memory circuit and logic circuit are embedded.

6 Claims, 14 Drawing Sheets

FABRICATION METHOD OF SEMICONDUCTOR DEVICE WITH CAPACITOR

BACKGROUND OF THE INVENTION

1. Field of the Invention

The present invention relates to a semiconductor device and a method of fabricating a semiconductor device. Particularly, the present invention relates to a semiconductor device having a capacitor such as a DRAM (Dynamic Random Access Memory), and a method of fabricating such a semiconductor device.

2. Description of the Background Art

Reflecting the remarkable development of semiconductor devices in recent years, there is a great diversity in the category of semiconductor devices in accordance with their application and function. There are a plurality of methods in fabricating a semiconductor device of the same type. It is desirable to select an appropriate fabrication method matching their application and function. For example, there are various formation methods for a capacitor indispensable in a DRAM. It has become critical to select the optimum method of forming a capacitor according to the application and function.

A DRAM is generally constituted by a memory cell array which is the storage region to store various storage information, and a logic circuit controlling memory cells in the memory cell array for data input/output with an external source. A memory cell array is formed of a plurality of memory cells in a matrix, storing unitary storage information. In a general DRAM, a memory cell is formed of one MOS (Metal Oxide Semiconductor) transistor and one capacitor connected to the MOS transistor to store information. Such a memory cell is well known as a one-transistor one-capacitor type memory cell.

Figure 13:
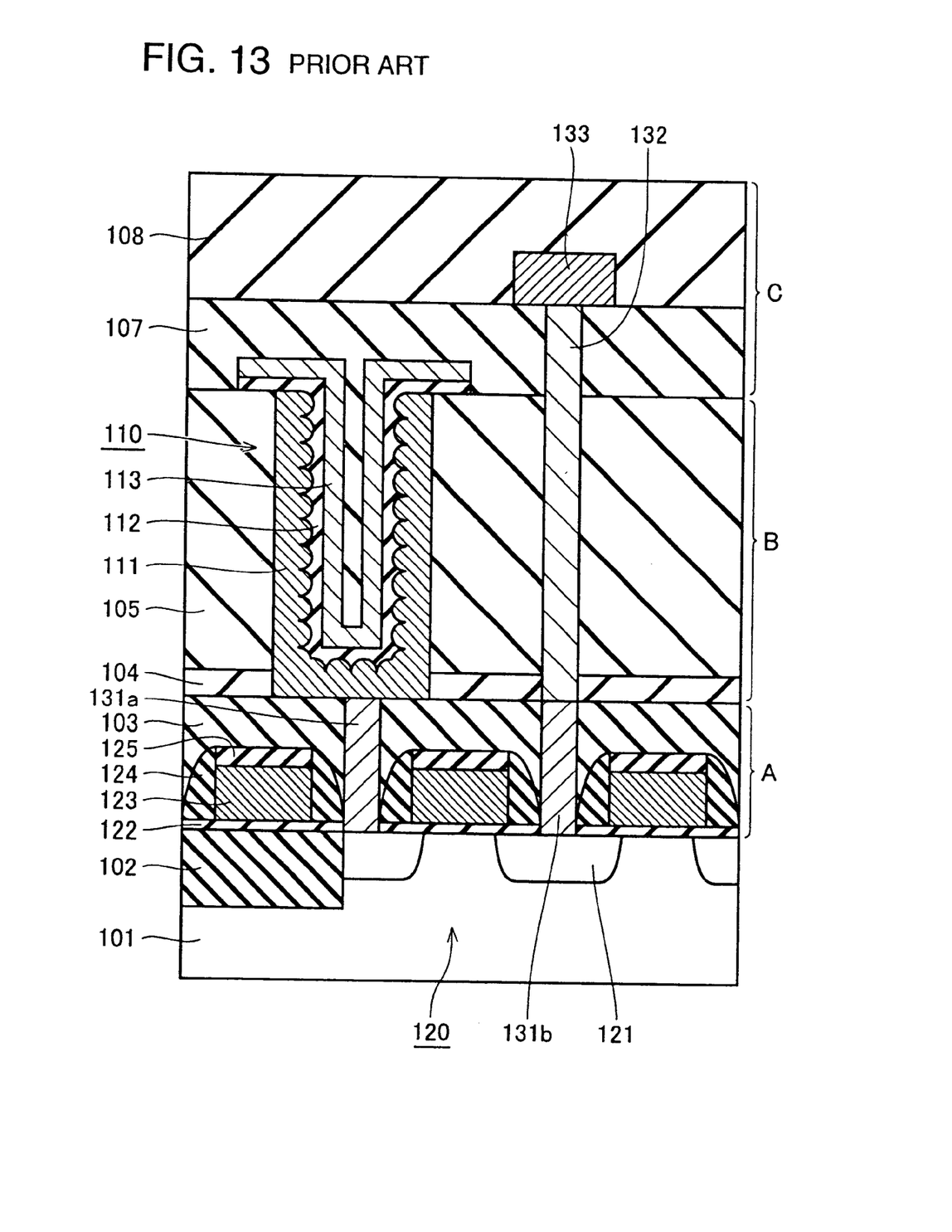
FIG. 13 is a sectional view of a structure of a semiconductor device having a conventional capacitor.

FIG. 13 is a schematic sectional view of a one-transistor one-capacitor memory cell in a DRAM to describe a structure thereof. Referring to FIG. 13, a plurality of MOS transistors 120 are formed at a main surface of a semiconductor substrate 101 electrically isolated by an isolation film 102 which is an element isolation region. MOS transistor 120 includes a source/drain diffusion layer 121 at an active region of the main surface of semiconductor substrate 101.

Three major layers are deposited on the main surface of semiconductor substrate 101. As shown in FIG. 13, the gate electrode layer and the like of MOS transistor 120 are formed at the lower most layer A of the three layers. At the intermediate layer B, a capacitor 110 and the like are formed. At the top most layer C, a metal line 133 and the like connecting memory cells with each other are formed.

First, the lower most layer A will be described. The main surface of semiconductor substrate 101 is covered by a thin gate oxide film 122. A gate electrode layer 123 is formed at a predetermined position above gate oxide film 122. Although not depicted, gate electrode layer 123 is constituted by a floating gate formed of a polycrystalline silicon layer into which impurities are introduced (referred to as "doped polysilicon layer" hereinafter), and a control gate formed of a tungsten silicide ($WSi_2$) layer.

A silicon nitride film 125 is formed on gate electrode layer 123. A sidewall 124 formed of a silicon oxide film is provided at the sidewall of gate electrode layer 123. Regarding the pair of source/drain diffusion layers 121, a pad layer 131a is connected to one of source/drain diffusion layers 121 and each bit line 131b is connected to the other of source/drain diffusion layers 121. An interlayer insulating film 103 is formed all over the main surface of semiconductor substrate 101 so as to fill the gap between pad layer 131a and bit line 131b and cover the surface of MOS transistor 120.

The intermediate layer B will be described here. On interlayer insulating film 103 of the above-described lower most layer A, a silicon nitride film 104 that is a stopper film for the formation of a trench used to form a capacitor, and a BPTEOS (Boro Phospho Tetra Ethyl Ortho Silicate) film 105 which is a spacer film are formed at the intermediate layer B. A trench for formation of a storage node is formed at a predetermined position in silicon nitride film 104 and BPTEOS film 105 so as to arrive at interlayer insulating film 103.

Capacitor 110 includes a storage node 111 which is a lower electrode, a capacitor dielectric layer 112, and a cell plate 113 which is an upper electrode. Storage node 111 is formed along the sidewall and bottom of the aforementioned trench. Storage node 111 is electrically connected to pad layer 131a at its bottom to be further connected to source/drain diffusion layer 121 of MOS transistor 120 via pad layer 131a. Cell plate 113 is formed facing storage node 111 with capacitor dielectric layer 112 therebetween.

At the top most layer C, interlayer insulating films 107 and 108 are formed so as to cover BPTEOS film 105 and capacitor 110 of the above-described intermediate layer B. A metal line 133 connecting metal cells with each other is formed in interlayer insulating films 107 and 108. Metal line 133 is electrically connected to source/drain diffusion layer 121 of MOS transistor 120 through a bit line 132 passing through intermediate layer B and a bit line 131b passing through lower most layer A.

A method of forming a DRAM capacitor of the foregoing structure will be described here. MOS transistor 120, pad layer 131a, bit line 131b and the like are formed in advance at the main surface of semiconductor substrate 101 in which isolation film 102 is formed. Lower most layer A is formed by providing an interlayer insulating film 103 so as to cover the surface thereof.

In the formation of a capacitor, first a silicon nitride film 104 is formed all over the main surface of interlayer insulating film 103 corresponding to the lower most layer A. Then, BPTEOS film 105 is formed thereon. A storage node formation trench is provided in silicon nitride film 104 and BPTEOS film 105 by conventional photolithography and etching techniques. Doped polysilicon layer 111 is formed so as to cover the sidewall and bottom of this storage node formation trench. Then, the surface of doped polysilicon layer 111 is roughened. This roughening process is applied to improve the capacitance of the capacitor.

The trench is filled with a photoresist. Using this photoresist as a mask, anisotropic etching is applied all over (etchback) until the surface of at least BPTEOS film 105 is exposed. When storage node 111 is formed by this etchback process, the photoresist in the trench is removed. Then, the native oxide film is removed by buffer hydrofluoric acid (BHF) using a mixture of hydrofluoric acid and ammonium fluoride. Following this removal, capacitor dielectric layer 112 and cell plate 113 are formed. Thus, a capacitor 110 is completed.

By forming a capacitor 110 using a silicon nitride film 104 which is a stopper film and a BPTEOS film 105 which is a spacer film, a cylinder type capacitor of a large capacitance can be obtained.

However, a semiconductor device fabricated by the above-described method had the problem that the reliability is low. This issue will be described in detail hereinafter.

The aforementioned roughening process is effected by growing crystal grains of silicon on the underlying layer which is the doped polysilicon layer. Conventionally, an etching process by BHF is carried out after the roughening process for the removal of the native oxide film. This BHF includes a mixture of hydrofluoric acid and ammonium fluoride. Silicon is etched by the ammonium fluoride.

The crystal grains readily fall off from the underlying layer. There is a possibility that these crystal grains will adhere onto the top surface of the BPTEOS film. The reattaching crystal grains may cause shorting between adjacent storage nodes, resulting in degradation of the reliability of the semiconductor device.

In etching back the doped polysilicon layer formed at the top face of the BPTEOS film, anisotropic etching was conventionally employed. This anisotropic etching generates residues along the sidewall of the pattern by the anisotropy of etching. Therefore, the upper end of the storage node will have a sharp edge along the sidewall when the etchback process is completed.

If an etching process is effected by BHF to remove the native oxide film, the top surface of the BPTEOS film will be removed. The aforementioned sharp edge portion will protrude from the top surface of the BPTEOS film. This protruding edge will easily be broken to fall off by vibration and the like encountered during the post process of rinsing. There is a possibility that the broken edge will adhere to the top surface of the BPTEOS to cause shorting between storage nodes. As a result, the reliability of the semiconductor device will be degraded.

Usage of a hydrofluoric acid solution ($HF+H_2O$) instead of BHF is possible for removing the native oxide film. However, in such a case, the P (phosphorus) included in the storage node for application of conductivity will be eluted into the hydrofluoric acid solution in the form of phosphoric acid ($PO_3$) from the surface of the storage node. This causes degradation of the conductivity of the storage node to reduce the capacitance of the capacitor. Thus, the reliability of the semiconductor device is degraded.

Figure 14:
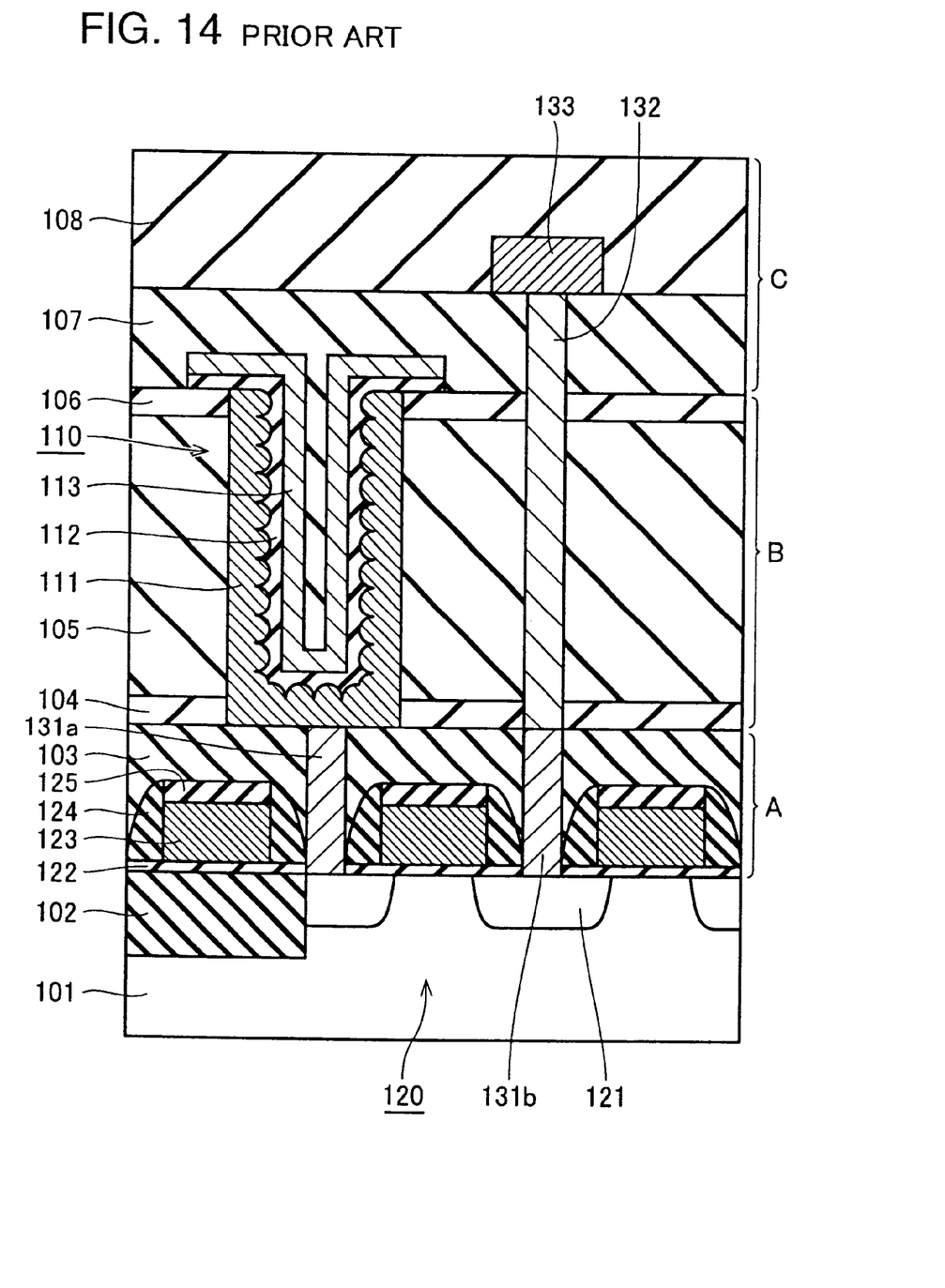
FIG. 14 is a schematic sectional view of another example of a structure of a semiconductor device with a conventional capacitor.

The foregoing problems were encountered when a spacer film is formed of a BPTEOS film. Japanese Patent Laying-Open No. 2001-203334 discloses a spacer film of a two-layered structure. A TEOS (Tetra Ethyl Ortho Silicate) film which is an etching stopper film is formed at the surface of BPTEOS film 105 which is a spacer film, as shown in FIG. 14, and the spacer film is formed on silicon nitride film 104. In this case, BPTEOS film 105 ensures the height of the capacitor whereas TEOS film 106 mainly functions as an etching stopper.

This TEOS film 106 is substantially absent of impurities such as phosphorous and boron. Therefore, TEOS film 106 is more difficult to be etched by the hydrofluoric acid solution than BPTEOS film 105, and plays the role of an etching stopper. It is therefore possible to use a hydrofluoric acid solution for the removal of the native oxide film from the surface of the storage node. In an etching process using hydrofluoric acid, silicon is less susceptible to etching than by etching using BHF including ammonium fluoride. It is therefore possible to prevent the silicon crystal grains of the storage node from falling off the underlying layer formed of doped polysilicon. Since shorting between storage nodes can be prevented, the reliability of the semiconductor device is improved.

It is to be noted that BPTEOS film 105 is formed by atmospheric CVD (chemical vapor deposition) and the film formation peak temperature is generally 300–450° C. The time required for growing this film is several minutes. In contrast, a TEOS film is formed by CVD under reduced pressure, and the film formation peak temperature is approximately 680° C. The time required for film growth is approximately one hour.

The demand for high speed and large capacity in recent semiconductor devices is high. Therefore, it is therefore necessary to facilitate minimization of the device per se. Furthermore, development of a system LSI (Large Scale Integrated circuit) corresponding to a combination of a semiconductor memory and logic circuit is now in progress in response to the versatility of information processing. Particularly, the combination of a DRAM memory circuit and a logic circuit to control this memory circuit, now called eDRAM, is viable to allow high speed processing for images of a great amount.

In the fabrication of such a system LSI, processing at low temperature in the fabrication process is required for the high performance of the logic circuit, in addition to miniaturization of the device per se. In order to prevent degradation of the performance of the logic circuit in the fabrication of the eDRAM, it is desirable to carry out processing at lower temperature in the capacitor formation step.

In the case where the formation step of the aforementioned cylinder type capacitor is employed, the TEOS film that does not substantially include impurities on the BPTEOS film has to be processed at the high temperature of 680° C. for one hour. In the case where the logic circuit is formed on the same semiconductor substrate, degradation in performance thereof is significant. This becomes a bar for the system LSI.

If attention is focused on miniaturization, the capacitor forming the memory circuit must be integrated at a higher scale. Since there is a limit in reducing the size of the capacitor while ensuring the capacitance, then the only parameter which can be varied is to narrow the distance between adjacent capacitors. In the case where capacitors are located in close proximity, the reliability of the insulating film present therebetween is critical. Particularly, in the case where polysilicon residues are present, leakage may occur at the interface of the layered films to result in shorting. Occurrence of shorting is further expected when the insulating film located between the capacitors is a film grown at low temperature.

SUMMARY OF THE INVENTION

In view of the foregoing, an object of the present invention is to provide a semiconductor device fabrication method that allows formation of a capacitor with a heat treatment at lower temperature, and a semiconductor device thereof. A particular object of the present invention is to provide a semiconductor device with a capacitor having performance degradation of a logic circuit in a system LSI prevented, and a fabrication method of such a semiconductor device.

Another object of the present invention is to provide a semiconductor device that can have shorting between adjacent capacitors integrated at high scale prevented, and a method of fabricating such a semiconductor device.

According to an aspect of the present invention, a fabrication method of a semiconductor device with a memory circuit including a capacitor and a first field effect transistor, and a logic circuit including a second field effect transistor provided on the same semiconductor substrate includes the step of growing an insulating film for capacitor formation to form a capacitor in a trench. The semiconductor device fabrication method is characterized in that the insulating film for capacitor formation is grown at a temperature equal to or below a predetermined temperature at which level performance degradation of the logic circuit is not induced.

In the step of growing an insulating film for capacitor formation carried out after first and second field effect transistors are formed in the present fabrication method, the insulating film for capacitor formation is grown at a processing temperature of a level that does not degrade the performance of the second field effect transistor forming the logic circuit. Thus, a semiconductor device of high performance and high reliability can be provided. It is confirmed that the predetermined temperature at which level performance degradation of the logic circuit is not induced is approximately 600° C. and below from experience. If a film growth process is effected at a higher temperature, there is a possibility of the electrical property of the field effect transistor forming the logic circuit being degraded.

In the semiconductor device fabrication method of the present aspect, the step of growing an insulating film for capacitor formation preferably includes the steps of: (1) forming a silicon nitride film on an interlayer insulating film formed so as to cover the first field effect transistor, (2) forming a first silicon oxide film including impurities by atmospheric pressure CVD on the silicon nitride film, and (3) forming a second silicon oxide film by either atmospheric pressure CVD or plasma CVD on the first silicon oxide film so as to be substantially absent of impurities.

By forming a second silicon oxide film substantially absent of impurities using either atmospheric pressure CVD or plasma CVD, processing can be effected at a temperature significantly lower than in the conventional case. Therefore, performance degradation of the logic circuit can be prevented.

In the semiconductor device fabrication method of the present aspect, the film formation peak temperature by atmospheric pressure CVD in growing the first silicon oxide film is preferably at least 300° C. and not higher than 450° C., and the film formation peak temperature by atmospheric pressure CVD in growing the second silicon oxide film is at least 300° C. and not higher than 450° C.

In the semiconductor device fabrication method of the present aspect, the film formation peak temperature by atmospheric pressure CVD in growing the first silicon oxide film is preferably at least 300° C. and not more than 450° C., and the film formation peak temperature by plasma CVD in growing the second silicon oxide film is preferably at least 200° C. and not more than 300° C.

According to another aspect of the present invention, a fabrication method of a semiconductor device with a memory circuit including a capacitor and a field effect transistor includes the steps of: (1) forming a silicon nitride film on an interlayer insulating film formed so as to cover the field effect transistor, (2) forming a silicon oxide film on the silicon nitride film, (3) forming a trench in the silicon nitride film and silicon oxide film so as to arrive at the interlayer insulating film, and forming an insulating film so as to cover the sidewall of the silicon oxide film forming the trench, and (4) forming a lower electrode of the capacitor in the trench so as to be electrically connected to a conductive region of the field effect transistor and located along the insulating film.

By the fabrication method of the present aspect, insulation between adjacent capacitors is ensured by the insulating film formed so as to cover the sidewall of the trench. Therefore, degradation in the performance and reliability due to increase in integration density can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

First Embodiment

Figure 1:
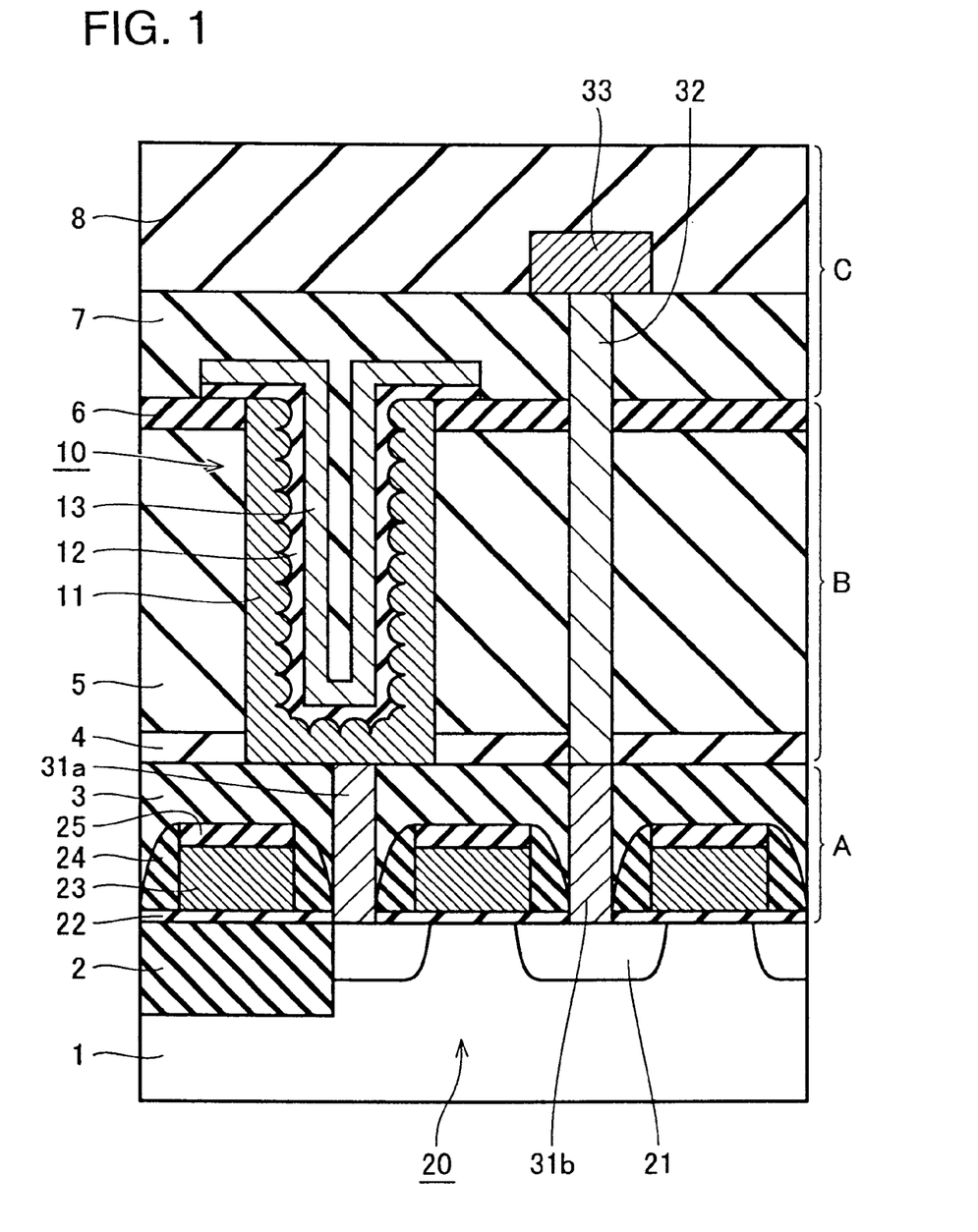
FIG. 1 is a schematic sectional view of a semiconductor device according to a first embodiment of the present invention.

Referring to FIG. 1, a semiconductor device of the first embodiment has a plurality of MOS transistors 20 formed at the main surface of a semiconductor substrate 1 electrically isolated by an isolation film 2 that is an element isolation region. This MOS transistor 20 includes a source/drain diffusion layer 21 at an active region at the main surface of semiconductor substrate 1.

On the main surface of semiconductor substrate 1, three major layers are deposited. Of the three layers, the lower most layer A has a gate electrode layer and the like of MOS transistor 20 formed. A capacitor 10 and the like are formed at the intermediate layer B. Metal lines 33 and the like coupling memory cells with each other are formed at the top most layer C. The semiconductor device of the present embodiment has a structure similar to that of the aforementioned conventional case, provided that the structure of the spacer layer in the intermediate layer B differs.

First, the lower most layer A will be described. The main surface of semiconductor substrate 1 is covered by a thin gate oxide film 22. A gate electrode layer 23 is formed at a predetermined position above gate oxide film 22. Although not shown, gate electrode layer 23 is constituted by a floating gate formed of a doped polysilicon layer into which impurities are introduced, and a control gate formed of a tungsten silicide ($WSi_2$) layer.

A silicon nitride film 25 is formed on gate electrode layer 23. A sidewall 24 formed of a silicon oxide film is provided at the sidewall of gate electrode layer 23. With regards to the pair of source/drain diffusion layers 21, one of source/drain diffusion layers 21 is connected to a pad layer 31a and the other is connected to each bit line 31b. Also, an interlayer insulating film 3 is formed all over the main surface of semiconductor substrate 1 so as to fill the gap between pad layer 31a and bit line 31b and to cover the surface of MOS transistor 20.

In the intermediate layer B, a silicon nitride film 4 which is a stopper film, a BPTEOS film 5 which is a spacer film, and a silicon oxide film 6 which is an etching stopper film and a spacer film grown at a low temperature are formed on interlayer insulating film 3 of the lower most layer A. As this silicon oxide film 6 grown at low temperature, an NSG (Non-doped Silicate Glass) film or a plasma $SiO_2$ film can be listed. These NSG film and plasma $SiO_2$ film are distinguishable from the conventionally-employed TEOS film by the difference in the etching rate through hydrogen fluoride (HF) treatment. A trench for storage node formation is formed in silicon nitride film 4, BPTEOS film 5, and silicon oxide film 6 grown at low temperature.

Capacitor 10 includes a storage node 11 which is a lower electrode, a capacitor dielectric layer 12, and a cell plate 13 which is the upper electrode. Storage node 11 is formed along the sidewall and bottom wall of the aforementioned trench. Storage node 11 is electrically connected to pad layer 31a at its bottom, and further connected to source/drain diffusion layer 21 of MOS transistor 20 via pad layer 31a. Cell plate 13 is formed to face storage node 11 with capacitor dielectric layer therebetween.

At the top most layer C, interlayer insulating films 7 and 8 are formed so as to cover silicon oxide film formed at low temperature and capacitor 10 of intermediate layer B. A metal line 33 connecting memory cells with each other is formed in interlayer insulating films 7 and 8. Metal line 33 is electrically connected to source/drain diffusion layer 21 of MOS transistor 20 through a bit line 32 passing through intermediate layer B and a bit line 31b passing through lower most layer A.

Figure 2:
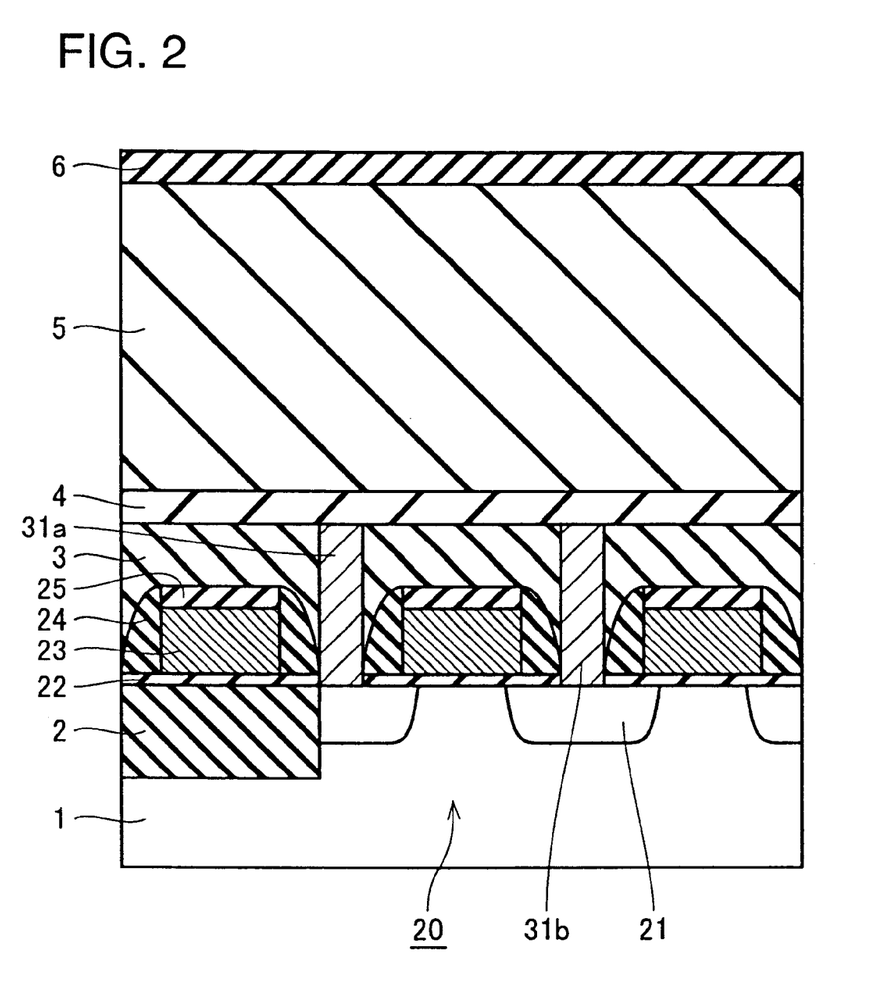
FIGS. 2, 3, 4, 5, 6, 7 and 8 are schematic sectional views of the semiconductor device of the first embodiment corresponding to a first step, a second step, a third step, a fourth step, a fifth step, a sixth step, and a seventh step, respectively.

A method of fabricating this semiconductor device of the present embodiment will be described with reference to FIGS. 2–8. Referring to FIG. 2, MOS transistor 20, pad layer 31a, bit line 31b and the like are formed in advance at the main surface of semiconductor substrate 1 where isolation film 2 is formed. Interlayer insulating film 3 is formed so as to cover the surface thereof to complete the formation of the lower most layer A.

In the formation of a capacitor, a silicon nitride film 4 is formed all over the main surface of interlayer insulating film 3 at the lower most layer A. Then, BPTEOS film 5 and silicon oxide film 6 grown at low temperature are provided thereon. It is to be noted that silicon nitride film 4 is formed by low pressure CVD whereas BPTEOS film 5 is formed by atmospheric pressure CVD. Silicon oxide film 6 grown at low temperature is formed by either atmospheric pressure CVD or plasma CVD.

Figure 3:
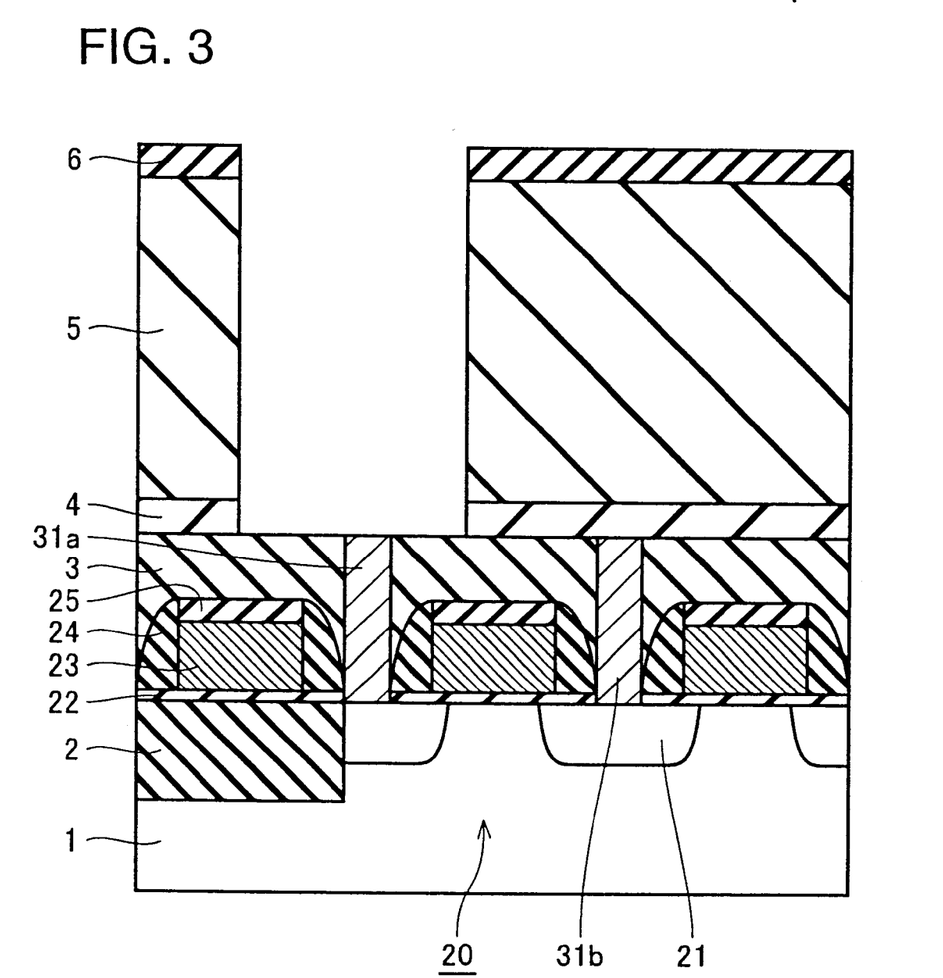
Figure 4:
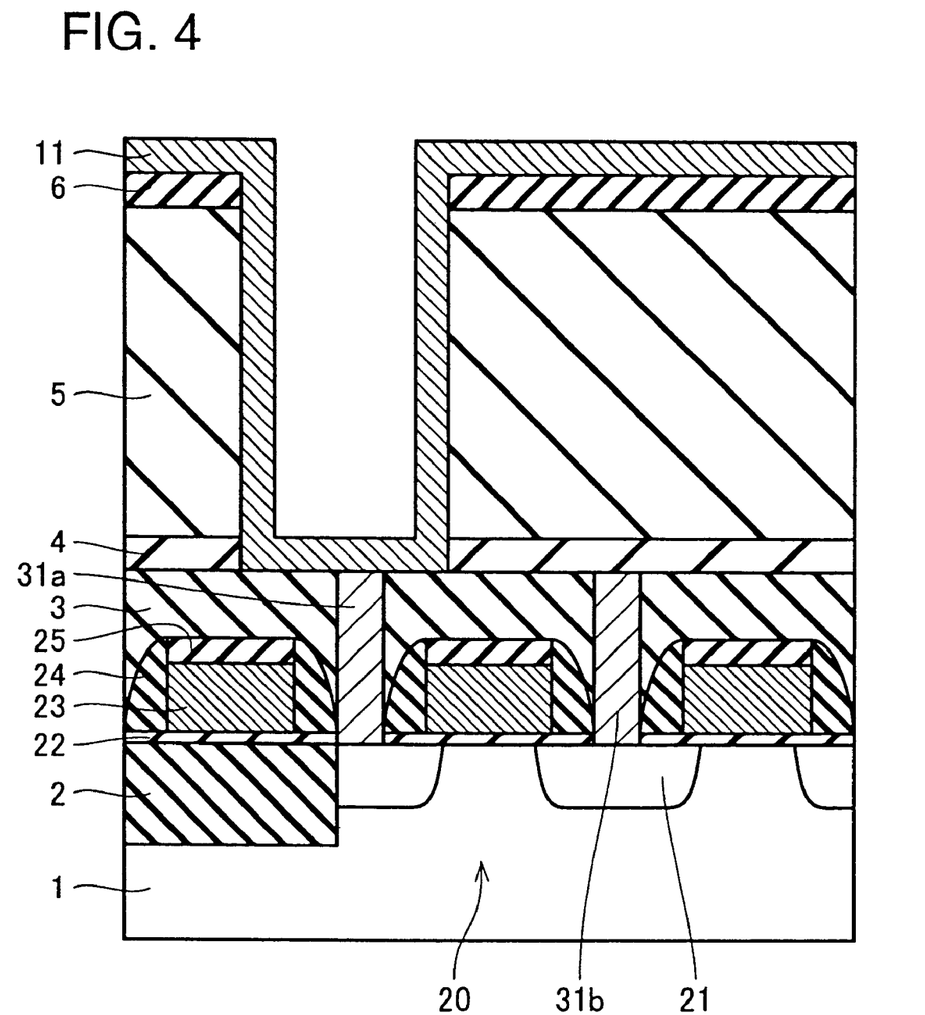

Referring to FIG. 3, a trench for storage node formation is provided by general photolithography and etching in silicon nitride film 4, BPTEOS film 5 and silicon oxide film 6. Referring to FIG. 4, a doped polysilicon layer 11 is formed so as to cover the sidewall and the bottom wall of the trench for storage node formation. At this stage, the surface of silicon oxide film 6 grown at low temperature is also covered by doped polysilicon layer 11.

Figure 5:
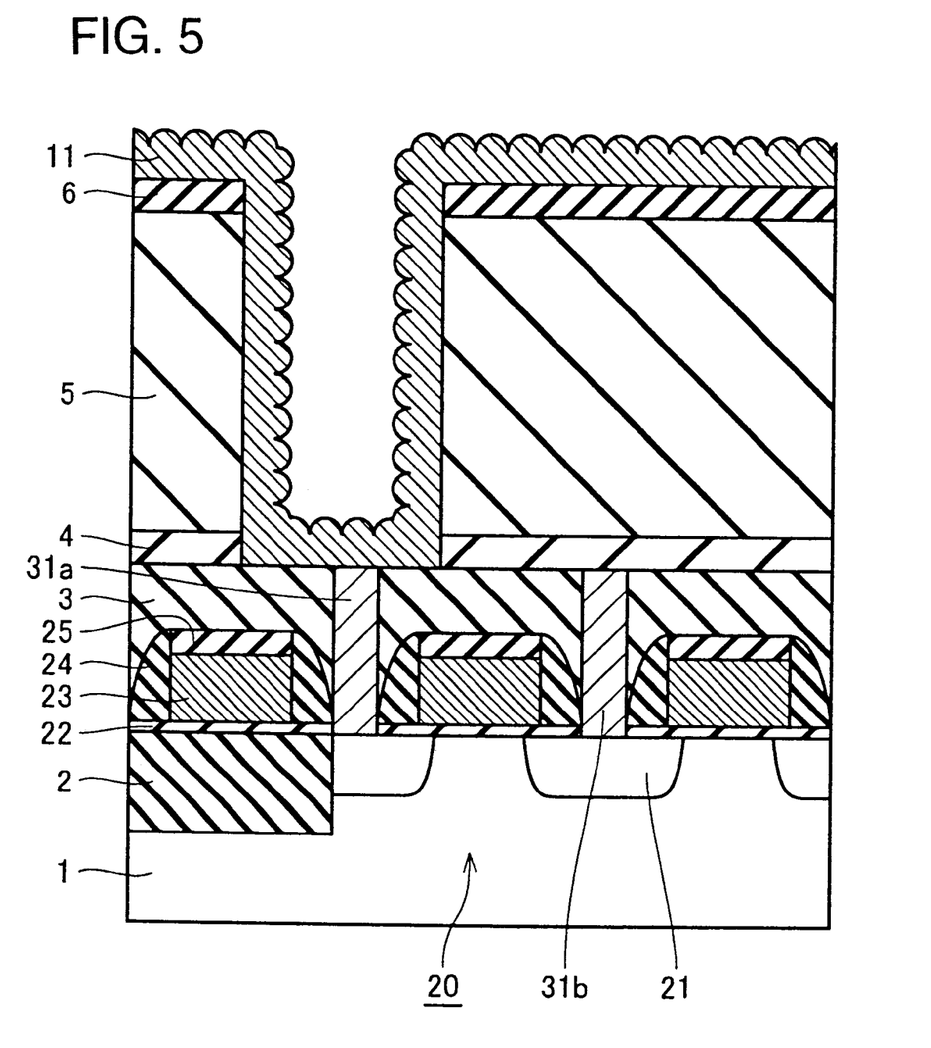

Referring to FIG. 5, the surface of doped polysilicon layer 11 is roughened. This roughening process is effected by growing silicon crystal grains on the doped polysilicon layer which is the underlying layer. This roughening process is effected to increase the capacitance of the capacitor.

Figure 6:
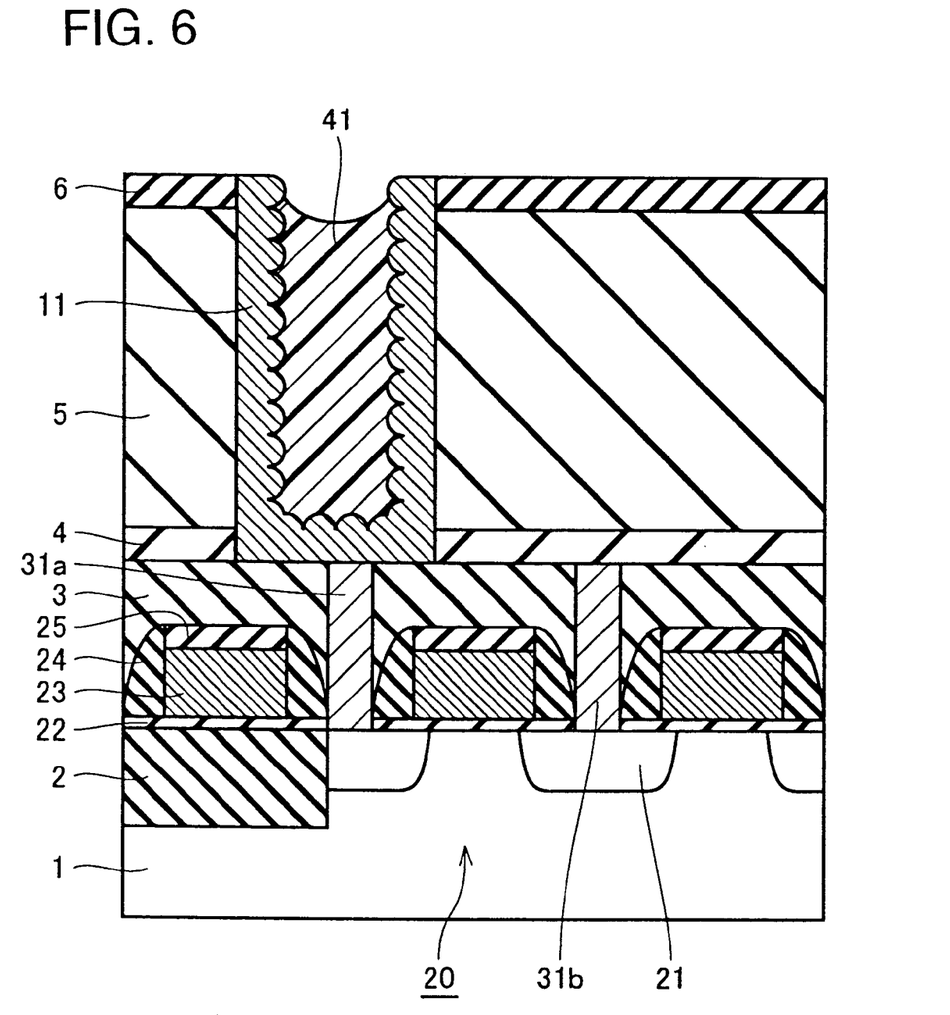
Figure 7:
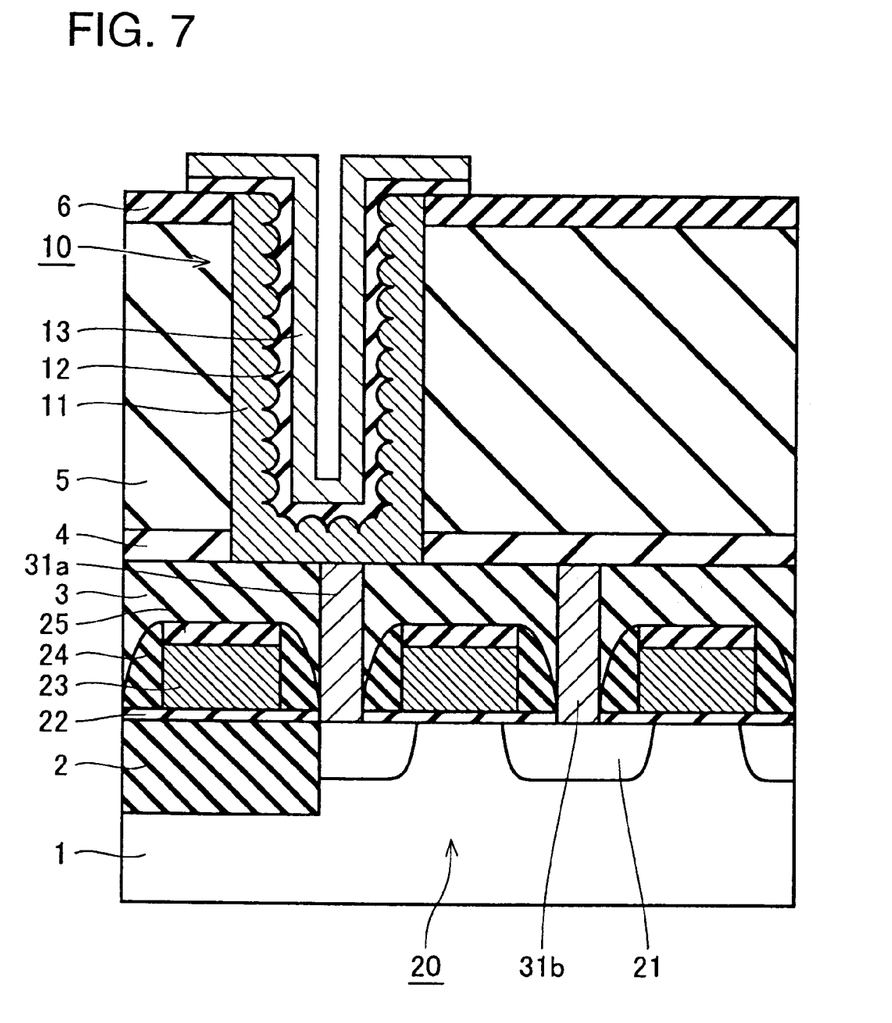

Then, the trench is filled with a photoresist. Using this photoresist as a mask, the doped polysilicon layer is etched anisotropically (etch back) until the surface of at least silicon oxide film 6 grown at low temperature is exposed. When storage node 11 as shown in FIG. 6 is shaped by this etchback process, the photoresist in the trench is removed. Then, the native oxide film is removed using a hydrofluoric acid solution, and capacitor dielectric layer 12 and cell plate 13 are formed. Thus, capacitor 10 is completed as shown in FIG. 7.

Figure 8:
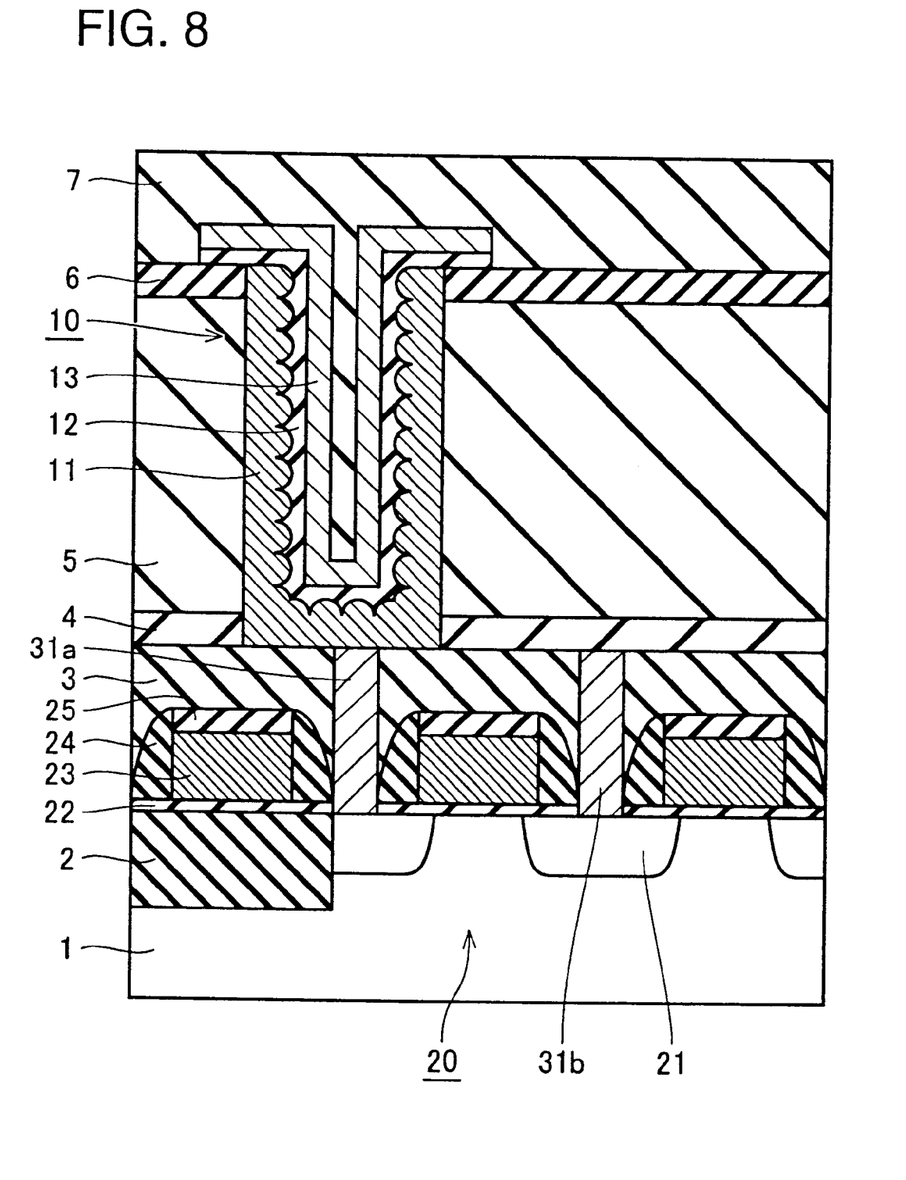

Referring to FIG. 8, interlayer insulating film 7 is formed so as to cover capacitor 10 and silicon oxide film 6. The general wiring processing is effected. Thus, the semiconductor device having the structure shown in FIG. 1 is completed.

In fabricating a semiconductor device having a memory circuit and logic circuit incorporated on the same substrate in the present embodiment, an NSG film or plasma $SiO_2$ film is used instead of a TEOS film that was conventionally used as an etching stopper film. Since an NSG film grown through atmospheric pressure CVD and a plasma $SiO_2$ film grown through plasma CVD can be formed at a low temperature in a short period of time, there is no concern of degradation in the performance of the logic circuit. Thus, a semiconductor device of high reliability and high performance can be fabricated.

EXAMPLE 1

A first example according to the first embodiment will be described here. In the first example, silicon oxide film 6 grown at low temperature among the films that constitute the semiconductor device of FIG. 1 was an NSG film. Silicon nitride film 4 was formed through low pressure CVD. The film thickness was 50 nm. The film formation peak temperature was 600° C. and the film growing time was approximately one hour. BPTEOS film 5 which is a spacer film was formed through atmospheric pressure CVD to a film thickness of 1200 nm. The film formation peak temperature was approximately 300° C.–450° C. and the film growing time was approximately several minutes. The NSG film which is a low temperature grown film was formed by atmospheric pressure CVD to a film thickness of 200 nm. The film formation peak temperature was approximately 300° C.–450° C., and the film growing time was approximately several minutes.

It was confirmed by the inventor of the present invention that a capacitor is formed with no particular problem by observing the cross sectional configuration of the capacitor of the semiconductor device fabricated as described above using an SEM (Scanning Electron Microscope).

EXAMPLE 2

In the second example, silicon oxide film 6 formed at low temperature among the aforementioned three films was a plasma $SiO_2$ film. This plasma $SiO_2$ film was formed through plasma CVD to a thickness of 200 nm. The film formation peak temperature was 200° C.–300° C. and the film growing time was approximately several minutes.

It was confirmed by the inventor that a capacitor is formed with no particular problem by observing, using an SEM the cross sectional configuration of the capacitor of the semiconductor device fabricated according to the second example.

Second Embodiment

Figure 9:
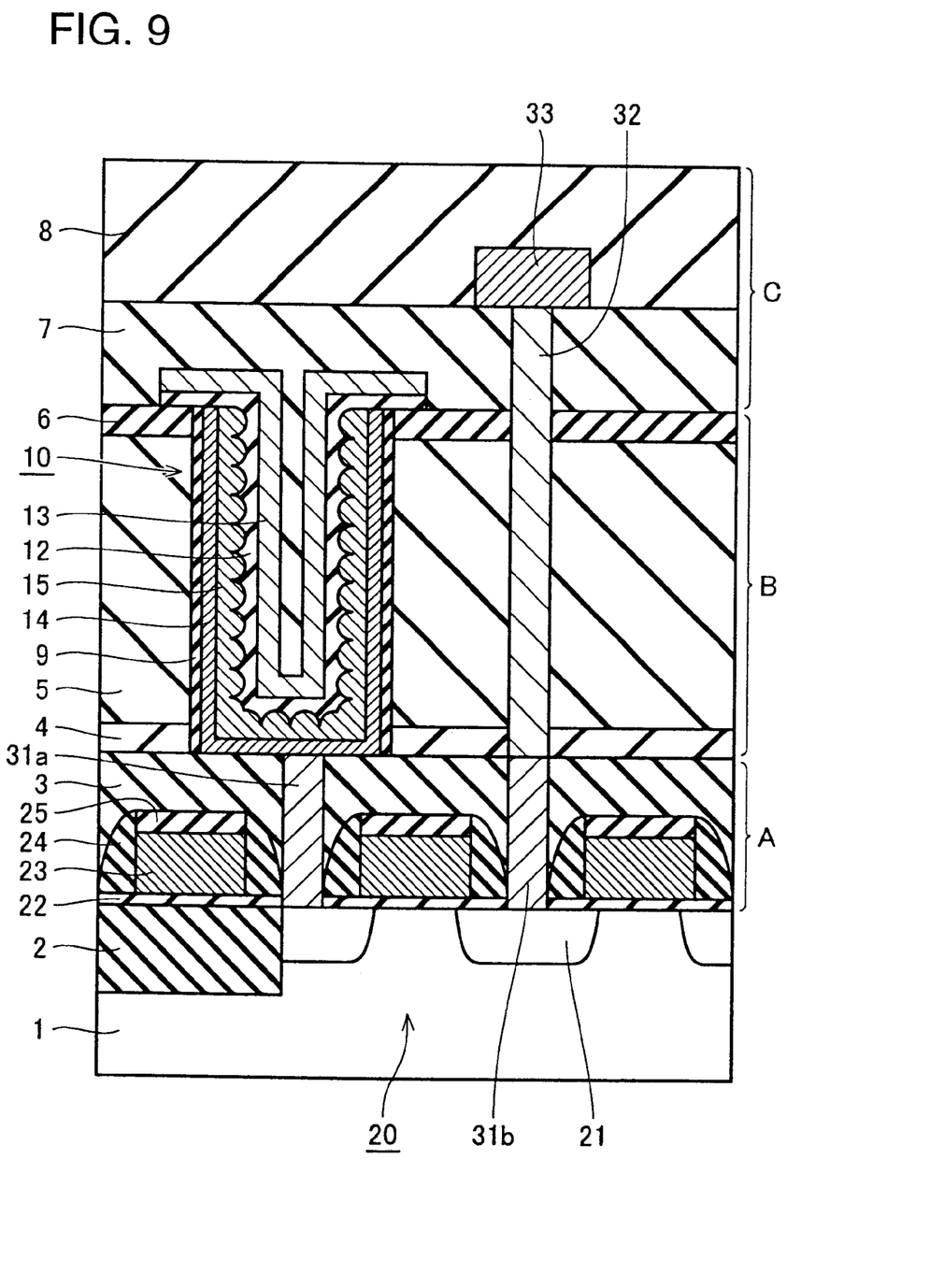
FIG. 9 is a schematic sectional view of a semiconductor device according to a second embodiment of the present invention.
Figure 10:
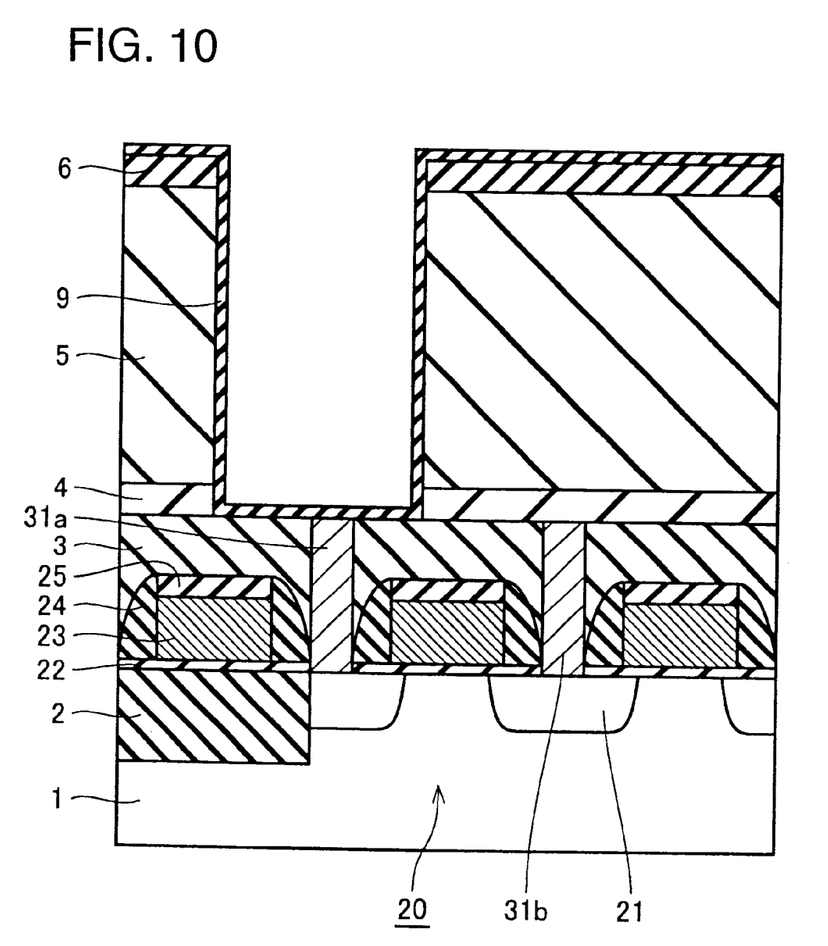
FIGS. 10, 11 and 12 are sectional views of the semiconductor device of the second embodiment showing a fabrication method thereof.

Referring to FIG. 9, a semiconductor device of the second embodiment has a sidewall protection film provided at the sidewall of the trench where the capacitor is formed in addition to the above-described first embodiment. Also, the storage node is formed of two layers, i.e., a doped polysilicon layer and an undoped polysilicon layer. The remaining elements are similar to those of the previous first embodiment, and description thereof will not be repeated.

The semiconductor device of the second embodiment includes a sidewall protection film 9 between the sidewall of the trench for capacitor formation in silicon nitride film 4 which is a stopper film, BPTEOS film 5 which is a spacer film, and silicon oxide film 6 which is an etching stopper film, and the storage node of the capacitor. Sidewall protection film 9 functions to prevent shorting between adjacent capacitors. Sidewall protection film 9 is formed of an insulating film such as a silicon nitride film.

The storage node of the capacitor differs from the first embodiment in that the storage node is formed of a two layered structure of a doped polysilicon layer and an undoped polysilicon layer. This two layered structure is well known, and is intended to increase the capacitance of the capacitor by altering arbitrarily the thickness of the two polysilicon layers.

Figure 11:
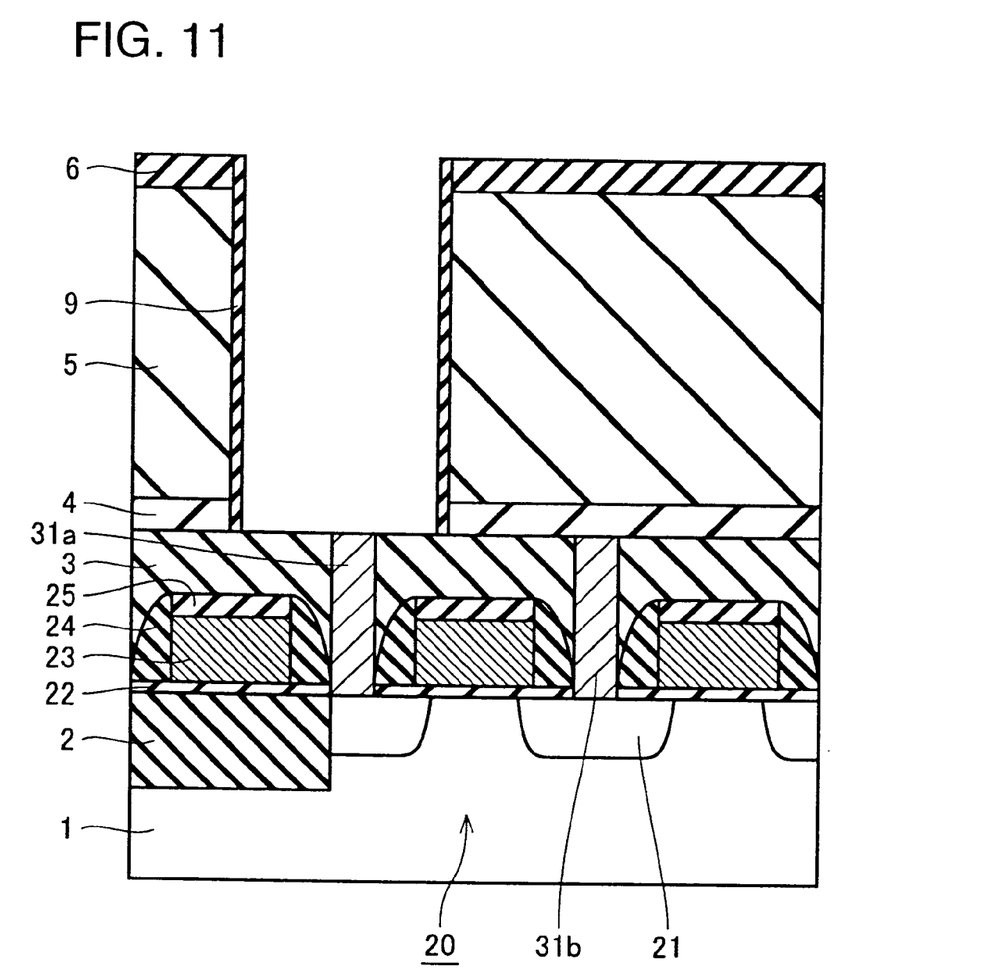
Figure 12:
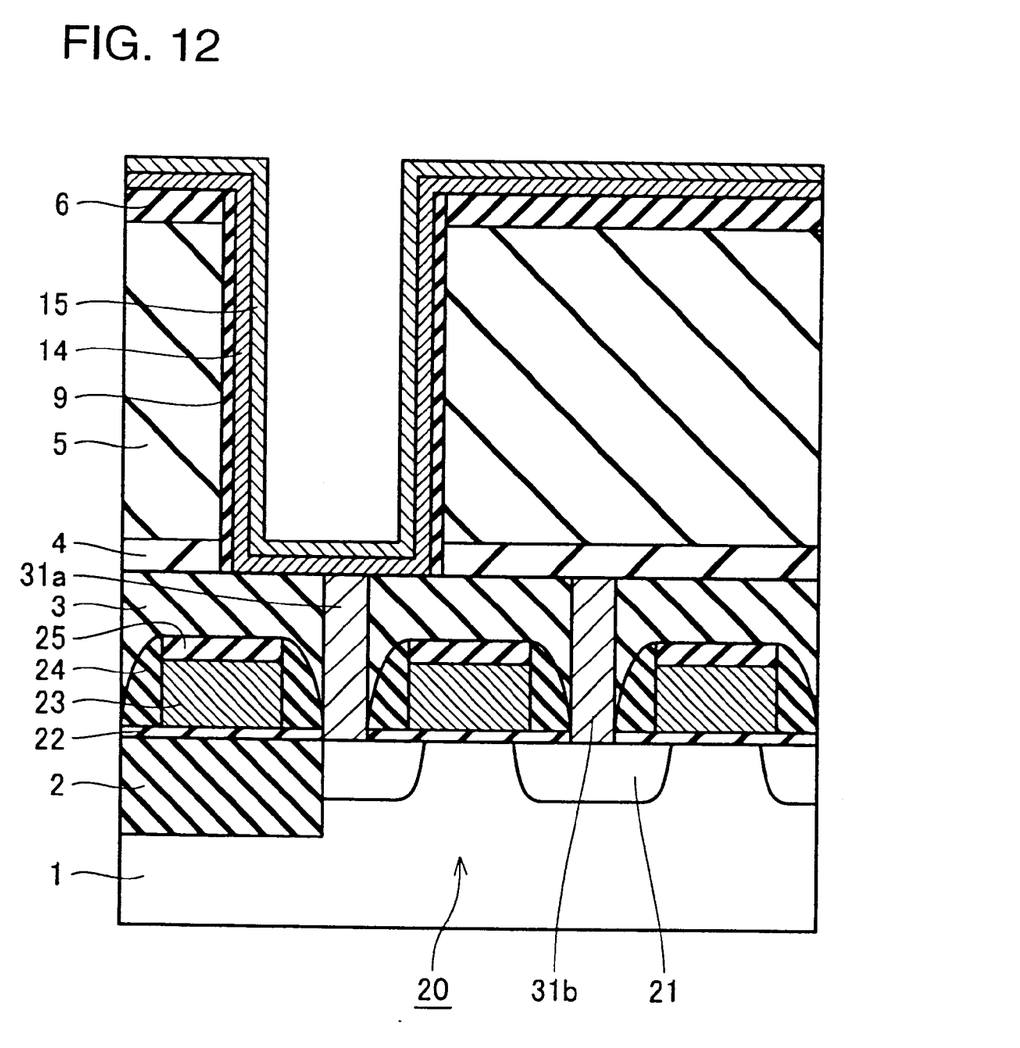

In the fabrication method of the semiconductor device of the present embodiment, a thin silicon nitride film is formed using low pressure CVD so that at least the sidewall of the trench is covered (refer to FIG. 11) at the end of the step corresponding to FIG. 3 in the semiconductor device fabrication method described in the previous first embodiment. The film thickness of the thin silicon nitride film is preferably approximately 10 nm–30 nm. Then, etching is effected so that only the silicon nitride film formed at the sidewall in the trench remains, whereby sidewall protection film 9 is formed (refer to FIG. 12). Doped polysilicon layer 14 and undoped polysilicon layer 15 are then sequentially deposited. The steps thereafter are similar to those following the step of FIG. 5 in the previous first embodiment. Thus, a semiconductor device of the structure shown in FIG. 9 is completed.

By providing a sidewall protection film formed of an insulating film between the capacitor and the sidewall of the trench, shorting between adjacent capacitors can be reliably prevented. It is expected that the distance between capacitors will further become smaller in accordance with the increase in integration density. It is extremely effective to provide a sidewall protection film to prevent shorting. This is particularly effective in the case where a polysilicon layer grown at low temperature is employed as in the present structure.

The first and second embodiments were described in which a BPTEOS film is used for the first silicon oxide film formed so as to include phosphorus and boron with an organic material as the raw material. The present invention is not limited thereto, and other material may be used for the first silicon oxide film.

Also, the silicon nitride film exemplified as the sidewall protection film in the second embodiment is not limited thereto and may be an insulating film of another material. For example, it is expected that a similar advantage can be achieved with an NSG film or plasma $SiO_2$ film.

As a semiconductor device with a sidewall protection film in the above second embodiment, the present invention is applied to a semiconductor device that has the memory circuit and the logic circuit provided on the same semiconductor substrate and a silicon oxide film which is a film grown at low temperature is employed as an etching stopper film. However, the present invention is not limited to particularly a system LSI, and can be applied to any semiconductor device with a capacitor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A fabrication method of a semiconductor device including, on a same semiconductor substrate, a memory circuit having a capacitor and a first field effect transistor and a logic circuit having a filed effect transistor, the method comprising:
    forming a first silicon oxide film including impurities over the substrate;
    growing a second silicon oxide film substantially without impurities on the first silicon oxide film at a temperature not greater than a temperature at which performance degradation of such logic circuit is induced;
    forming a trench in the first and second silicon oxide film; and
    forming a capacitor in the trench.

2. The fabrication method of a semiconductor device according to claim 1, comprising:
    forming the transistor over the substrate;
    forming an interlayer insulating film over the transistor;
    forming a silicon nitride film on the interlayer insulating film;
    forming the first silicon oxide film on said silicon nitride film by atmospheric pressure CVD (chemical vapor deposition); and
    forming the second silicon oxide on said first silicon oxide film by atmospheric pressure CVD or plasma CVD.

3. The fabrication method of a semiconductor device according to claim 2, comprising:
    growing said first silicon oxide film at a peak temperature of least 300° C. and not more than 450° C. by atmospheric pressure CVD; and
    growing said second silicon oxide film at a peak temperature of at least 300° C. and not more than 450° C. by mospheric pressure CVD.

4. The fabrication method of a semiconductor device according to claim 2, comprising:
    growing said first silicon oxide film at a peak temperature of at least 300° C. and not more than 450° C. by atmospheric pressure CVD; and
    growing said second silicon oxide film at a peak temperature of at least 200° C. and not more than 300° C. by plasma CVD.

5. A fabrication method of a semiconductor device including a memory circuit having a capacitor and a field effect transistor, comprising the steps of:
    forming a silicon nitride film on an interlayer insulating film formed so as to cover said field effect transistor;
    forming a silicon oxide film on said silicon nitride film;
    forming a trench so as t arrive at said interlayer insulating film in said silicon nitride film and said silicon oxide film, and forming an insulating film so as to cover a sidewall of said silicon oxide film forming said trench; and
    forming in said trench a lower electrode of a capacitor electrically connected to a conductive region of said field effect transistor and located along said insulating film.

6. The fabrication method of a semiconductor device according to claim 5, wherein said insulating film includes a silicon nitride film.

* * * * *